(12) United States Patent
Berlin

(10) Patent No.: US 12,413,214 B2
(45) Date of Patent: Sep. 9, 2025

(54) METHOD AND MACHINE FOR THE DISCRIMINATION OF THE SPACETIME SEPARATION BETWEEN WAVE PACKETS

(71) Applicant: Joseph N. Berlin, Coatesville, PA (US)

(72) Inventor: Joseph N. Berlin, Coatesville, PA (US)

(*) Notice: Subject to any disclaimer, the term of this patent is extended or adjusted under 35 U.S.C. 154(b) by 490 days.

(21) Appl. No.: 17/824,006

(22) Filed: May 25, 2022

(65) Prior Publication Data

US 2023/0387899 A1 Nov. 30, 2023

(51) Int. Cl.
*H03K 5/1252* (2006.01)
*G01F 1/66* (2022.01)
*H03K 5/26* (2006.01)
*G02F 1/21* (2006.01)
*H04B 3/52* (2006.01)

(52) U.S. Cl.
CPC ............ *H03K 5/1252* (2013.01); *G01F 1/66* (2013.01); *H03K 5/26* (2013.01); *G02F 1/21* (2013.01); *H04B 3/52* (2013.01)

(58) Field of Classification Search
USPC .......................................................... 702/48
See application file for complete search history.

(56) References Cited

U.S. PATENT DOCUMENTS

| | | | |
|---|---|---|---|
| 2005/0074199 A1* | 4/2005 | Shahar | G02F 1/225 385/15 |
| 2020/0067625 A1* | 2/2020 | Henry | H04J 14/04 |
| 2020/0195338 A1* | 6/2020 | Barzegar | H04B 7/15578 |
| 2022/0352356 A1* | 11/2022 | Mannhart | H10D 48/383 |
| 2023/0300805 A1* | 9/2023 | Li | H04W 72/51 370/329 |
| 2024/0403677 A1* | 12/2024 | Eichenfield | H10N 30/20 |

* cited by examiner

*Primary Examiner* — Paul D Lee
(74) *Attorney, Agent, or Firm* — Ballard Spahr LLP

(57) ABSTRACT

A method for the discrimination of spacetime separation between input wave packets includes producing a potential for constructive interference between said input wave packets, transmitting the input wave packets if they exhibit an amplitude above a predetermined threshold by achieving constructive interference and rejecting the input wave packets which do not exhibit said amplitude above the predetermined threshold. A machine employing the claimed method uses waveguides, filters and electromagnetic inductors arranged to combine the input wave packets, evaluate, and pass or reject the wave packets.

8 Claims, 7 Drawing Sheets

METHOD AND MACHINE FOR THE DISCRIMINATION OF THE SPACETIME SEPARATION BETWEEN WAVE PACKETS

FIELD OF THE INVENTION

This invention relates to methods and machines for examining spacial or temporal separation between wave packets.

BACKGROUND

It is an object of the invention described herein to produce a discrimination of the spatial separation, or equivalently of the temporal separation, between two more wave packets (such as electronic signal pulses) which originate from one or more waveguides (such as conductive wires).

Wave packet propagation through waveguides and waveform interferometry in general is the field of the invention. Although there are many types of wave packets and waveguide paradigms, discrete electrical wave packet propagation on conductive wires stands out as a clear candidate of this invention.

This emphasis on electrical wave packets should not constrain the application, uses or ramifications of this invention to electrical wave packet propagation and interference only, but rather this document should be construed to claim and encompass the invention's application to all other forms of interfering wave packets on waveguides (such as photon wave packets in fiber optic waveguides) as long as a functional analogue of each required component is produced.

FIG. 1 illustrates Amplitude vs. Displacement (in space or time), i.e. 'oscilloscope view', of two co-moving wave packets A and B separated by a displacement $\Delta S(t)$ on a waveguide. The wave packets' spatial separation $\Delta s$ is directly proportional to their time separation ($\Delta t$) by the known propagation speed of the wave packets on the waveguide(s) and can thus be referred to as the wave packets' spacetime separation $\Delta S(t)$. $\Delta S(t)$ is constant due to the wave packets' shared propagation speed.

Two co-moving wave packets (e.g. electronic pulses) are shown in FIG. 1. The time separation between the wave packets is referred to as $\Delta t$, and the (equivalent) space separation is denoted as $\Delta s$. To first order, these wave packets travel at the same speed along their respective (or shared) waveguide(s) and thus $\Delta t$ and $\Delta s$ are both constants.

Applications for the discrimination of the spacetime separation $\Delta S(t)$ between two or more wave packets include time-of-flight and lifetime measurements in atomic and high energy physics (i.e. the coincidence method), testing of integrated circuits, digital and analogue data analysis, laser and sonar interferometry, and others. Insofar as any two or more events may be converted (via detection of each event) into representative wave packets on waveguide(s), the invention may be used to produce the discrimination of the spacetime separation $\Delta S(t)$ between two or more events of any kind.

Known prior art inventions which determine $\Delta S(t)$ between wave packets, employ the method of time-comparison, which relies upon one or more detector, a clock of some kind and a method to compare timestamps. The detector, when impinged by a wave packet, samples a clock in real time, producing a timestamp corresponding to the time-evolving parameter of the clock at the moment when the clock was sampled, by the detection event. Timestamps are compared to each other, after the fact, revealing the sought-after time interval ($\Delta t$) between events. This time interval is used to calculate the space interval by the known speed of the wave packet propagation.

In order to understand the time-comparison method, a brief discussion of what constitutes a clock is called for. Clocks can take various forms, from natural periodic motion like the solar year, to the atomic electron oscillations employed by atomic clocks, to the known discharge function of an RC circuit, to the half-life of a radioactive sample. The basic feature of clocks is the maintenance of a predictable and independent motion. This does not require periodicity; non-periodic but predictable, independent motion (such as radioactive decay rates or the charging up an RC circuit at a constant voltage) can be used as a clock by noting the time-evolving parameter of the physical process at the moment of detection of a first wave packet and checking the value of the time-evolving parameter at the moment of detection of a second wave packet. A knowledge of the time-evolution of the predictable, independent physical process allows for the comparison of two more values of the time-evolving parameter, resulting in a calculated time separation $\Delta t$ between the wave packets' impinging of the wave packet detector. From this, a spatial separation $\Delta s$ between the wave packets may be calculated from the known propagation speed of the wave packets on the waveguide(s). These non-periodic but predictable and independent systems are herein considered clocks, too, with each data point of the time-evolving parameter functioning precisely like a timestamp for comparison after the fact.

Known prior art for determining the spacetime separation $\Delta S(t)$ between two or more wave packets employ the above-described time-comparison method, whereby a clock produces a timestamp when a wave packet impinges a detector; multiple timestamps are compared against each other after the fact, i.e. they are subtracted off, and the time separation between the wave packets is thereby calculated. The spatial separation $\Delta s$ is deduced by multiplying the known propagation speed of the wave packets by the calculated time separation $\Delta t$.

For time-comparators, the clock is both its lifeblood and its hubris. Clocks are the limiting factor with regards to performance and cost. If finer resolution is desired for one's discrimination of $\Delta t$ (i.e. $\Delta s$), faster oscillations (cycles) are required for the clock. That is, one needs a faster clock (or a shorter-time-scale physical process) with finer-grained timestamps to achieve faster time-resolution of the wave packets (such as electrical signal pulses), and therefore better time resolution of the displacement between them. This reality is the source of myriad functional (performance) and cost (economical) limitations associated with this ubiquitous prior art technique.

In short, the prior art (time comparison) requires an active system with moving parts (a clock) in order to discriminate spacetime separations between wave packets by the method of timestamp comparison.

The claimed invention employs a high-amplitude pass filter, i.e. some means for the production of the transmission of wave packets if they exhibit an amplitude greater than some minimum amplitude and for the production of the reflection of wave packets if they exhibit an amplitude less than the minimum amplitude. An object which can produce the transmission of "sufficiently tall" wave packets and produce the reflection of "too short" wave packets is pertinent to this prior art discussion. In the electronic realm, the diode stands out as an obvious low-hanging fruit that fits this bill, so a brief discussion of the diode is called for.

Electronic diodes have been employed in research and industry for over 100 years. Diodes can be thought of as a one-way valve for electronic current; i.e. they (ideally) permit the flow of current above some threshold voltage in one direction and they (ideally) reject the flow of current (of any voltage) in the opposing direction. Diodes have found many applications in technology such as light emitters (LEDs), AC to DC rectifiers, radio-photon receivers, thermometers, and myriad uses in computer logic. However, diodes have not been used to achieve the discrimination of the spacetime separation $\Delta S(t)$ between two electrical signal pulses, between two wave packets of any other kind, or between two particles or events.

Monostable one-shots (MSOS) collect current into an RC (or other time-constant) circuit, whereby the voltage in the circuit decays over time after the injection of a first wave packet. If two or more wave packets impinge the circuit of a MSOS within some time window, the resulting voltage in the circuit rises above the tripping threshold of some high-pass-filtering means (such as a diode), and an output wave packet is released from the circuit. Monostable one-shots differ fundamentally from the invention in that they employ a clock, i.e. a predictable and independent motion (the discharged of the RC circuit), to produce a summation of the injected voltage of the second wave packet and the residual voltage of the primary wave packet at the moment of its injection. MSOS discriminates the existence of wave packet separations which are "less than or equal to" $\Delta S(t)$ instead of "equal to" $\Delta S(t)$, as in the invention. The resistors in the fifth example embodiment (see below) do not interact with a capacitor or inductor, and thus do not smear out the wave packets into a constant voltage across the waveguide's "diode box" of the fifth example embodiment, the discrete wave packet structure is maintained during reflections within the "diode box" of the fifth example embodiment and thus contributes to interferometric (spacetime sensitive) constructive interference with other wave packets instead of a simple equilibrium-voltage summation, as in MSOS. All discussed embodiments differ fundamentally from MSOS in that they produce the real-time summation of wave packet flux without 'storing' of 'banking' it in a circuit for some time period (the known time-evolution of the stored wave flux in the 'bank' functions just like a clock).

SUMMARY OF THE INVENTION

The invention disclosed and claimed herein provides a means by which to produce a discrimination of one or more specific spacetime separations $\Delta S(t)$ between two or more wave packets on one or more waveguides, such as electronic wave packets on conductive wire(s).

The invention employs an amplitude discriminator, such as a high-pass filter, and a means for the production of continuing constructive interference between two or more wave packets in the case that they exhibit a specific spacetime separation $\Delta S(t)$, such as by dovetailing two or more waveguides onto a shared waveguide. In this way, a discrimination of the synchrony/overlap of those wave packets is achieved by amplitude discrimination in the event that such synchrony/overlap occurs.

Further, the discrimination of an arbitrary, non-zero spacetime separation ($\Delta S(t) \neq 0$) between wave packets is achieved through other means and provide non-trivial improvements to the more basic form.

In an example embodiment (the first example embodiment), the invention discriminates the existence of synchrony or overlap between two or more wave packets ($\Delta S(t)=0$), which each originate from their own waveguide. The means for the production of constructive interference in one embodiments is by dovetailing waveguides onto a shared waveguide so that wave packet traveling onto the shared waveguide (in the same direction) have the opportunity to 'mingle' with another wave packet from the other waveguide for an extended period of time/distance, if the relative timing/spacing allows for it.

In another example embodiment (the second example embodiment), a different means for the production of constructive interference is employed, namely passing one or more waveguides through a remote transducer, such as an electromagnetic inductor, for the purpose of producing/inducing a wave packet on a shared, but physically separate waveguide. The input waveguide(s) is either passed through the transducer in the same direction multiple times (the fourth example embodiment) with a known distance of waveguide suspended between successive passes through the transducer in order to discriminate $\Delta S(t)$ between wave packets originating from the same input waveguide or, more simply, two or more input waveguides are passed through a single transducer (the second example embodiment) in order to discriminate the spacetime separation $\Delta S(t)$ between wave packets from two or more input waveguides. If the wave packets travel side-by-side through the transducer at the same moment, they producing constructive interference between two induced wave packets on the separate waveguide, resulting in nominal doubling of the amplitude of the induced wave packet as compared to a single, non-interfering induced wave packet caused by just one input wave packet passing through the inductor without accompaniment by a second input wave packet.

In all example embodiments described herein, the shared waveguide leads into some means for the production of the amplitude discrimination of wave packets, such as a high-pass-filter, i.e. a means which transmits wave packets if and only if they exhibit an amplitude that exceeds some minimum threshold, rejecting wave packets of smaller amplitude. For simplicity's sake (and because the electronic embodiments of the invention are clearly of importance and interest), the term diode will be used herein as a shorthand for any means which produces the high-pass filter effect employed herein, which is itself merely a preferred form of amplitude discrimination. This acknowledges that non-electronic wave packet and waveguide paradigms exist and can be employed by this invention, in which case the diode refers to a high-pass filter in that wave propagation paradigm, or some other amplitude-discrimination means in that paradigm.

The diode discriminates incoming wave packets as a function of their amplitude (admitting only sufficiently 'tall' wave packets and rejecting 'too short' wave packets).

Synchrony/overlap/constructive interference between two or more wave packets on the shared waveguide is revealed by their increased amplitude, which can be discriminated directly (and passively) by the diode. That is, if the wave packets exhibit synchrony/overlap on the shared waveguide, their combined amplitude (by design) is above the 'threshold amplitude' of the diode, whereas the amplitude of a single wave packet (by design) is below the 'threshold amplitude' of the diode. In this way, two or more constructively-interfering wave packets will transmit through the diode and produce an output signal, whereas a non-interfering wave packet will reflect away from the diode and not produce an output signal. In the embodiments, this 'rejected' wave packet flows to ground or it is dissipated away as heat.

Embodiments expand upon this idea significantly and allow for the discrimination of any time or space separation (not just synchrony/overlap) between two or more wave packets by one or more improvements upon this simple mechanism.

The invention may be described as a passive system (such as an electronic circuit) which produces an output wave packet if and only if it is impinged by two or more wave packets (such as electronic signal pulses) which are separated by a specific spacetime separation $\Delta S(t)$. In the case that two or more impinging wave packets exhibit the specific spacetime separation $\Delta S(t)$, they produce constructive interference on a shared waveguide, thereby tricking the high-amplitude pass filter, such as a diode, into transmitting their combined wave packet by virtue of its increased amplitude. That is, the high-pass filter has the job of admitting sufficiently interfered (synchronous) wave packets and rejecting insufficiently interfered (asynchronous) wave packets. This simple but novel use of the high-pass filter grants the invention a spacetime-discrimination capability, as is explained below and improved and expanded upon by many example embodiments.

Example embodiments achieve the constructive interference of said wave packets by several methods including dovetailing two or more waveguides (5) (such as wires which each carry one or more wave packets, such as electronic pulses) onto a shared waveguide, (6) whereupon they travel together and are permitted to interfere. If constructive interference is achieved on the shared waveguide, the overlapping, superposed plurality of wave packets exhibit an increased amplitude which allows them (moving together) to pass through the attached high-amplitude-pass filter (7), such as a diode, and produce an output (8) signal. The threshold amplitude of the high-pass filter (7) and the shape/size of the input wave packets are intentionally chosen with respect to each other so as to admit through the high-pass filter (7) only a premeditated plurality of constructively-interfering wave packets and reject single (non-interfering) wave packets (or those with detectable but insufficient constructive interference, see the sixth example embodiment).

Instead of manipulating the input wave packets directly, as in the first example embodiment, improvements on the invention (the second and fourth example embodiments) produce secondary, or 'proxy', wave packets on one or more unshared waveguides (5A, 5B) by some means, such as by sampling the input waveguide(s) (1) via electromagnetic induction or some other remote transduction means at two or more locations along one or more input waveguides. In the fifth example embodiment, these unshared waveguides carrying the proxy wave packets are dovetailed onto a shared waveguide (6) in order to produce constructive interference for the satisfaction of an attached high-pass-filter (7), in an embedded version of the first example embodiment. In the second example embodiment, the simultaneous passing of wave packets through the transducer (the EM inductor) produces constructive interference of induced wave packets on (6) without a physical dovetail/juncture method.

By lengthening one unshared waveguide (5A, 5B) (or otherwise delaying the flux from one unshared waveguide), or by changing the distance between the transducer (2) locations on the input waveguide (1), non-zero spacetime separations ($\Delta S(t) \neq 0$) between input wave packets are discriminated by the invention. That is, one of two non-synchronous wave packets is delayed by a known amount in order to produce synchronous wave packets which can be discerned by the high-pass filter method of this invention.

An example method for discriminating superposition of a plurality of input wave packets may comprise:

producing a potential for constructive interference between the input wave packets;

transmitting the input wave packets if they exhibit an amplitude above a predetermined threshold by achieving the constructive interference; and rejecting the input wave packets which do not exhibit the amplitude above the predetermined threshold.

In an example embodiment, producing the potential for the constructive interference may comprise combining the input wave packets. In an example embodiment, a semiconductor diode may be used for rejecting the input wave packets which do not exhibit the amplitude above the predetermined threshold. Further by way of example, the method may comprise delaying a spacetime propagation of one or more of the input wave packets. The delay of the spacetime propagation may comprise lengthening one or more input waveguides on which the input wave packets propagate. In various example embodiments the input wave packets may have amplitude profiles which are centrally peaked with respect to time.

Another example method for discriminating spacetime separation between a plurality of input wave packets uses a superposition of a plurality of proxy wave packets. In a specific example embodiment the method comprises:

transducing wave flux of the plurality of input wave packets thereby producing the plurality of proxy wave packets;

producing a potential for constructive interference between the plurality of proxy wave packets;

transmitting the plurality of proxy wave packets if they exhibit an amplitude above a predetermined threshold by achieving the constructive interference; and rejecting the plurality of proxy wave packets which do not exhibit the amplitude above the predetermined threshold.

An example method may further comprise producing the potential for constructive interference between the plurality of proxy wave packets by simultaneously transducing the wave flux into a shared spacetime location. In another example, the potential for constructive interference between the plurality of proxy wave packets is achieved by combining the proxy wave packets. An example embodiment may further comprise delaying a spacetime propagation of one of the proxy wave packets. The input wave packets may have amplitude profiles which are centrally peaked with respect to time. Further by way of example, a method comprises producing a second plurality of proxy wave packets by transducing a wave flux of the plurality of input wave packets at a second spacetime separation. An example embodiment may further comprise discriminating a plurality of the spacetime separations between the input wave packets by repeating the transducing at different spacetime separations from one another.

The invention further encompasses a machine for discriminating a superposition of a plurality of input wave packets. In an example embodiment the machine comprises a means for producing constructive interference between the input wave packets and a means for producing amplitude discrimination of the input wave packets which is in communication with the means for producing constructive interference. In this example, the means for producing amplitude discrimination transmits the input wave packets if the input wave packets exhibit the constructive interference and thereby attain increased amplitude. The input wave packets transmitted comprise the amplitude discrimination of the superposition of the plurality of the input wave packets, and the input wave packets which do not exhibit the constructive interference are rejected by the means for producing amplitude discrimination. In an example embodiment, the input wave packets exhibit amplitude profiles which are centrally-peaked with respect to time. Further by way of example, the plurality of input wave packets may comprise electrical pulses.

In an example embodiment, the means for producing constructive interference may comprise physically combining two or more input waveguides onto a single shared waveguide. Further by way of example, the means for producing amplitude discrimination of the input wave packets may comprise a semiconductor diode.

In another example embodiment, a machine for discriminating spacetime separation between two or more input wave packets may comprise a plurality of electromagnetic inductors adapted to transduce wave flux from the input wave packets. Each electromagnetic inductor has an output waveguide adapted to carry a proxy wave packet. A shared waveguide is in electrical communication with the output waveguides, and a filter is in electrical communication with the shared waveguide. The filter is adapted to transmit or reject the proxy wave packets as a function of amplitude of the proxy wave packets. In an example embodiment the input wave packets may exhibit amplitude profiles which are centrally-peaked with respect to time. In a particular example embodiment the filter comprises a diode. One or more input waveguides may be in electrical communication with the electromagnetic inductors. Further by way of example, a means for producing a change in the spacetime separation between the proxy wave packets may also be included. In an example embodiment the means for producing a change in the spacetime separation between the proxy wave packets may comprise lengthening one of the output waveguides with respect to another of the output waveguides.

In another example embodiment of a machine for discriminating spacetime separation between a plurality of input wave packets according to the invention comprises a single electromagnetic inductor adapted to transduce wave flux from the plurality of input wave packets. The single inductor has an output waveguide adapted to carry a plurality of proxy wave packets, A filter in electrical communication with the output waveguide is adapted to transmit or reject the proxy wave packets as a function of amplitude of the proxy wave packets. The input wave packets may exhibit amplitude profiles which are centrally-peaked with respect to time in an example embodiment. Further by way of example, the input wave packets may be transmitted by one or more input wave guides. Additionally, the output waveguide may be in communication with one or more of the input waveguides. By way of example, the filter may comprise a semiconductor diode. An example embodiment may comprise one or more input waveguides. Each input waveguide is adapted into a loop topology, wherein the single electromagnetic inductor contains two or more substantially parallel sections of each the input waveguide. By way of example, the input wave packets may exhibit amplitude profiles which are centrally-peaked with respect to time. Complete superposition of the input wave packets produces a greatest possible combined amplitude and increasingly incomplete superposition of the input wave packets produces decreasing combined amplitudes in an example embodiment.

DETAILED DESCRIPTION

Figure 1:
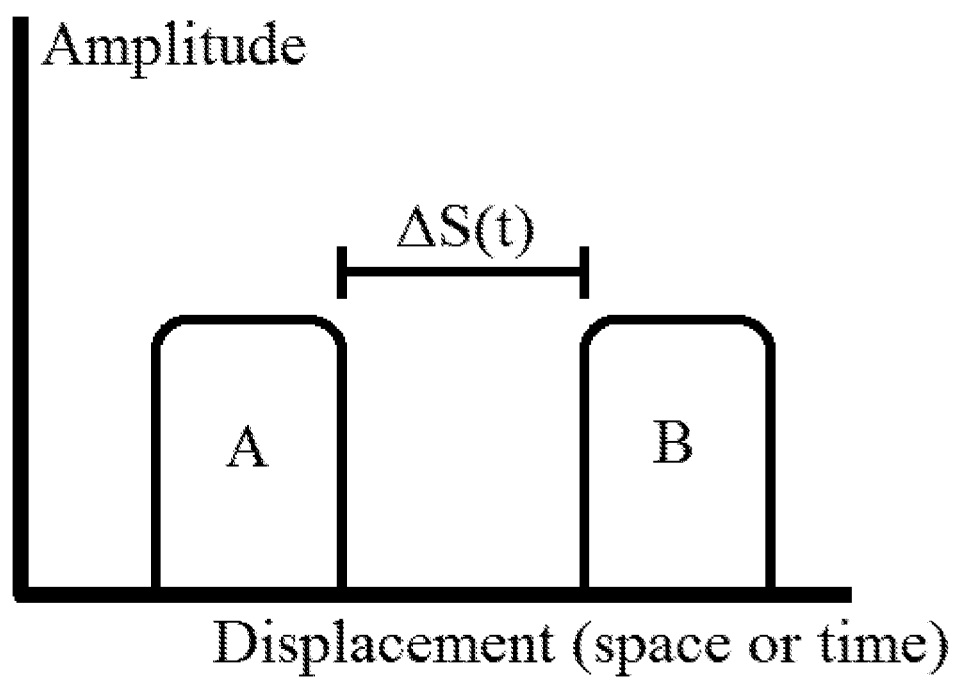
FIG. 1 is an Illustration of an Amplitude (e.g. Voltage) vs. Displacement plot for a pair of wave packets (e.g. electronic pulses) with a separation displacement of ΔS(t) (i.e. 'oscilloscope view').

FIG. 1 shows an illustration of Amplitude vs. Space (or, equivalently, Time) plot of a pair of wave packets (such as electrical pulses) originating from one or more waveguides (as if viewed on an oscilloscope). The wave packets exhibit a constant intervening spatial separation which is denoted as (Δs), or, equivalently, their intervening temporal separation which is denoted as (Δt), or compactly as the spacetime separation ΔS(t).

To first order approximation, the wave packets are considered to be moving in the same direction, at the same speed. The amplitude-dependent diffraction effects of wave packets on waveguides can be ignored in relevant amplitude realms and must be taken into account in other amplitude realms. That is, there is no strong tendency for superposed wave packets to drift apart, i.e. increase their spacetime separation, or attract each other, i.e. decrease their spacetime separation, and consequently their relative spacetime separation is fixed to some constant ΔS(t)=K.

Discriminating the spacetime separation ΔS(t) between wave packets is the object of the invention. This fundamental parameter of wave packet propagation on waveguides has myriad applications in electronic technology, including, but not limited to, the coincidence method of event sensing, interferometry methodologies such as radar, lidar and sonar, computer signaling and logic functions, frequency analyzers, and many others.

Figure 2:
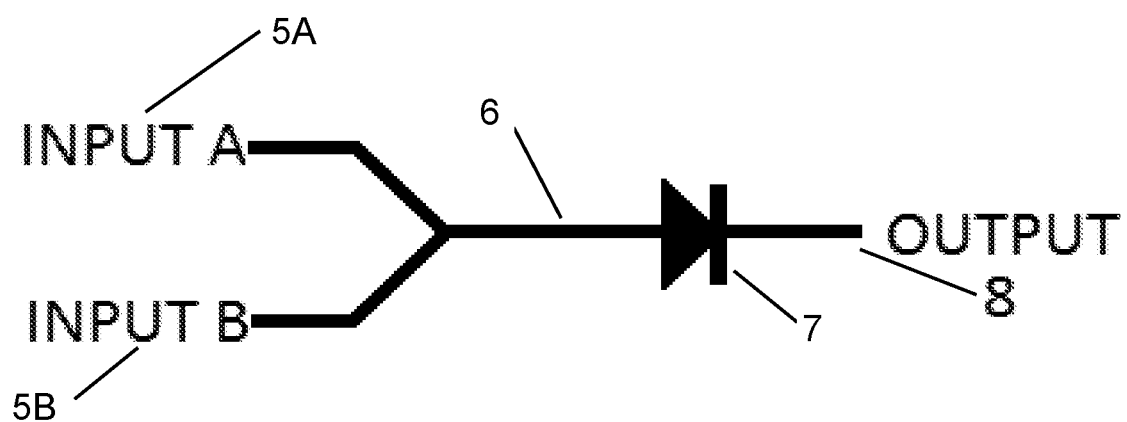
FIG. 2 is a schematic view of a basic electronic embodiment of the invention, namely the dovetail interference diode (a first example embodiment).

FIG. 2 is an illustration of a first example embodiment, i.e. the "Dovetail Interference Diode", i.e. a circuit schematic of a basic electronic embodiment of the invention whereby constructive interference is achieved by the physical joining of two or more waveguides (5A, 5B) onto a shared waveguide (6).

The purpose of this first example embodiment is to discriminate the existence of the synchrony or superposition of two wave packets upon a shared waveguide (6), which each originate from one of two input waveguides (5A, 5B). This is achieved by the means of the amplitude (Voltage) discrimination of the constructive-interference pattern of said wave packets (electronic pulses) on the shared waveguide (6), specifically by the high-pass voltage discrimination of an attached Diode (7).

Wave packets (such as electrical pulses) from the two input waveguides (5A and 5B) are, by a simple but specific geometry/topology, dovetailed onto a shared waveguide (6), whereupon they may produce maintained constructive interference and superposition due to their shared propagation speed. The shared waveguide (6) leads into a Diode (7), which leads to Output waveguide (8).

If the input wave packets, once dovetailed, exhibit sufficient constructive interference on the shared waveguide(6), the resulting 'combined' wave packet exhibits an increased amplitude, which is (by design) sufficient to pass over the amplitude (voltage) threshold of the Diode (7), producing an Output (8). In such a case, the input wave packets were known to have been synchronous/overlapping on the shared waveguide (6) (i.e. $\Delta S(t)=0$). In this and only this scenario will the Diode (7) transmit a wave packet and produce a signal onto the Output waveguide (8). In this way, the invention exhibits the ability to passively discriminate one specific spacetime separation between two (or more) wave packets (namely $\Delta S(t)=0$).

This is a basic electronic Embodiment of the invention and shares much functionality with all other Embodiments (they are improvements upon this Embodiment, have this Embodiment "embedded" within them, or utilize a simultaneous remote induction method to produce constructive interference, instead, as in a second example embodiment and a fifth example embodiment, below). This same basic form, as applied to other (i.e. non-electronic) wave packet propagation schemes with equivalent analogue components, is well represented by FIG. 2 as well, with the Diode (7) as a stand-in for a generalized high-pass amplitude filter.

Figure 3:
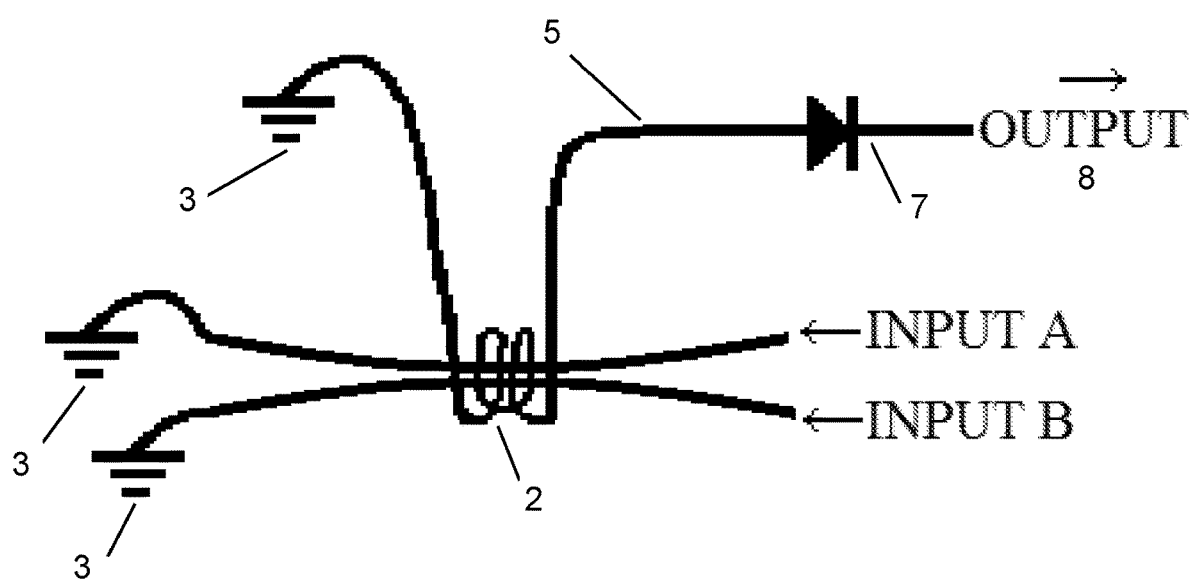
FIG. 3 is a schematic view of a second basic electronic embodiment of the invention, namely the induction interference diode (a second example embodiment).

FIG. 3 is an illustration of a second example embodiment, i.e. the "Induction Interference Diode", i.e. a circuit schematic of a basic electronic embodiment of the invention whereby the required constructive interference is achieved by the simultaneous remote induction of wave packets onto a shared waveguide (5) from two (or more) input waveguides (Input A, Input B) which pass through an electromagnetic inductor 2.

If wave packets travel through the inductor (2) at the same time, they induce pulses on the shared waveguide (5) at the same time, which causes said induced wave packets to exhibit constructive interference. The shared waveguide (5) leads into a high-amplitude-pass filter, namely a diode (7), for superposition discrimination as in other Embodiments.

Figure 4:
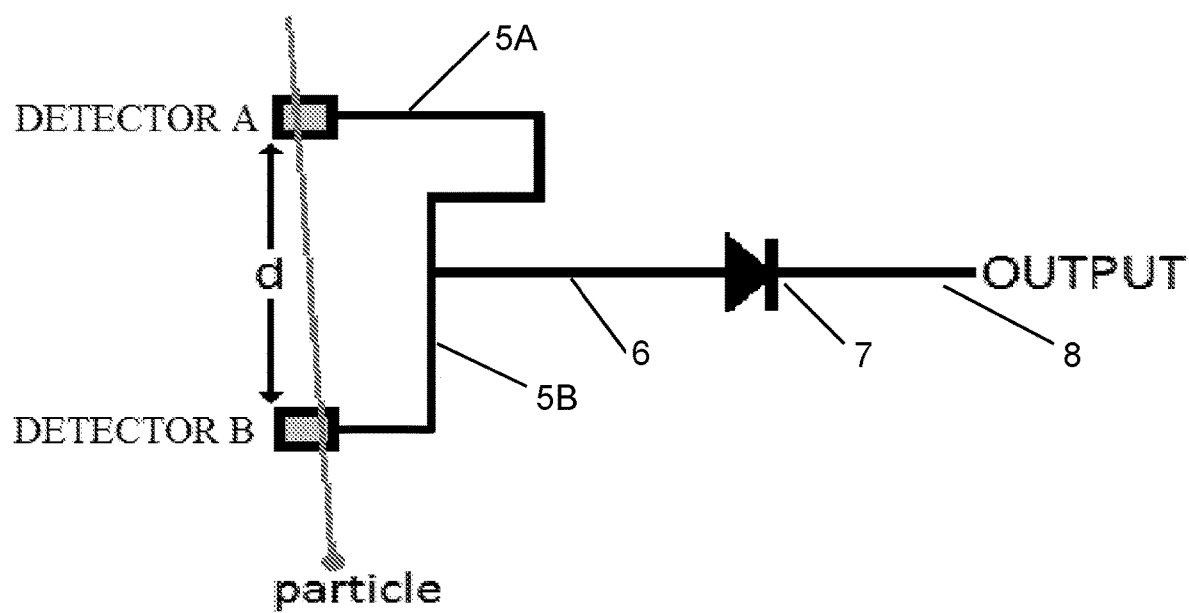
FIG. 4 is a schematic view of a dovetail interference diode as shown in FIG. 1 employed in a two-detector coincidence array, also called a particle telescope (a third example embodiment).

FIG. 4 is an illustration of a third example embodiment: a Particle Coincidence Array, or Particle Telescope comprised of two particle detectors A and B (such as Geiger counters, scintillator-detectors, Cherenkov-detectors, or others) and a modified version of the first example embodiment. The methodology of the second example embodiment could also easily accommodate this the third example embodiment.

When a particle passes through the detection volume of either detector A or B, it results in the production of an electronic signal pulse from the output of that detector. The object of a particle coincidence array in the prior art, and of the simple particle coincidence 'telescope' in FIG. 4, is to produce the directional discrimination of a penetrating particle by noting whether or not both detectors produce electronic output pulses with some specific spatial/temporal separation between them. This desired separation corresponds to the separation distance of the two detectors along the path of the particle convolved with the known/presumed speed of the particle.

The distance (d) between the two particle detectors, the known speed of the target particle, the relative length of wires 5A and 5B, and the transmission speed of the electronic pulses in the wire all factor together in producing a specific space separation $\Delta s$, or equivalently a specific time separation $\Delta t$, between input wave packets which will, once dovetailed, end up producing constructive interference on the shared waveguide (6) and therefore produce an Output (8) wave packet. Only in the case that both particle detectors fire in the proper order, with the proper delay between firings, will the detectors' resulting wave packets, once dovetailed onto a shared waveguide (6), produce constructive interference on the shared waveguide (6), and therefore only those wave packets will transmit through the Diode (7), producing an Output (8).

By varying the relative lengths of the dedicated wires (5A, 5B), different spacetime separations $\Delta S(t)$ between wave packets come 'into focus' of this third example embodiment. This Embodiment could be employed to a full-blown coincidence array with a vast plurality of detectors, instead of the simple two-detector 'telescope' shown in FIG. 3, with the use of a plurality of Interference Diodes and a multiplexed input arrangement (not shown).

Figure 5:
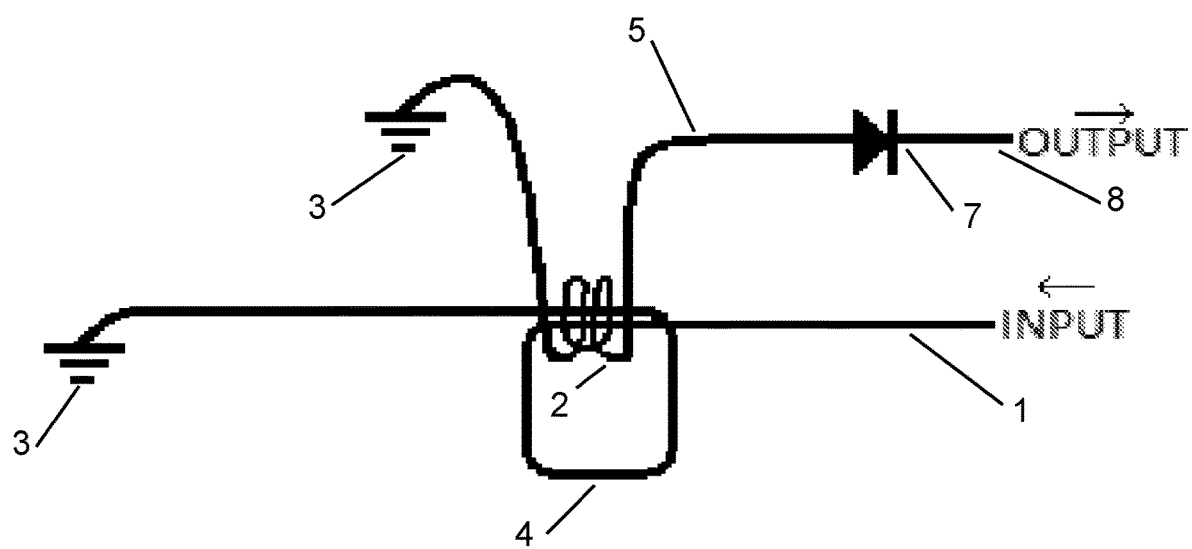
FIG. 5 is a schematic view of a loop inductor interference diode, for the purpose of discriminating ΔS(t) between two wave packets originating from the same waveguide (a fourth example embodiment).

FIG. 5 is an illustration of a fourth example embodiment: A circuit schematic of an improvement upon the invention, namely the "Loop Inductance Interference Diode".

The purpose of this embodiment is to produce the discrimination of some spacetime separation ($\Delta S(t)=K$, a constant) between two or more wave packets (specifically, discrete electronic pulses) which already exist on the same waveguide, as opposed to the first example embodiment and the second example embodiment, where the target wave packets originate on separate waveguides.

When a first (leading) electronic pulse (traveling leftwards on the input wire (1)), passes through the electromagnetic inductor (2), it produces (via electromagnetic induction) an electronic pulse on the inductance wire (5). This induced electronic pulse travels rightwards on the inductance wire (6), towards the attached Diode (7).

The induced pulse is of a significantly reduced amplitude as compared to the original wave packet on the input waveguide (1) due to the nature of electromagnetic induction. This proportional amplitude reduction is known and constant and can be taken into account when performing the amplitude discrimination by the Diode (7). Some parameters of the necessary calculation of amplitudes in this methodology include the amplitude of the input wave packets, the threshold amplitude of the Diode (7), and electromagnetic inductor properties (number of coils, radius of coils, etc).

When the first induced electronic pulse is created on the inductance wire (5) in the fourth example embodiment, it is alone and thus experiences no electromagnetic interference with other electronic pulses. Consequently, it is (by design) of an amplitude (voltage) insufficient to pass the Diode (7). Therefore, when it hits the Diode (7), it is reflected backwards and it travels back down the inductance wire (5) in the opposite direction, traveling through the electromagnetic inductor (2) and eventually to Ground (3).

If and only if the spacetime separation $\Delta S(t)$ between two input electronic pulses on the input wire (1) is equal to the loop-length (4) of input wire (1) between subsequent passes through the inductor (2), does the desired event occur, namely:

. . . at the moment when a second (trailing) wave packet passes through the electromagnetic inductor (2), the first (leading) wave packet passes through the electromagnetic inductor (2) for a second time, at the same moment! This causes the production (through electromagnetic induction) of a telltale, outsized wave packet in the inductor (2) which flows onto the inductor waveguide (5), which exhibits an amplitude nominally twice that of the first electromagnetically induced wave packet in this singly-looped embodiment.

This doubled-in-amplitude, constructively-interfered, induced electronic pulse travels along the inductor wire (5) and, unlike the first induced electronic pulse, is transmitted by the Diode (7) by virtue of its increased amplitude. This interfering wave packet thereby passes through the Diode (7) and forms an Output (8) wave packet.

This Output (8) wave packet denotes the just-prior existence of a pair of input wave packets with the specific spatial separation (As) equal to the loop length (4) of the input wire (1) strung between its successive passes through the electromagnetic inductor (2). Equivalently, a temporal separation between the two input electronic pulses is positively discriminated by such an Output (8) signal, this equivalence given by the known propagation speed of electronic pulses on the waveguides.

Finally, the second (trailing) pulse, upon traveling around the loop-length (4), will pass through the inductor (2) for a second time, thereby creating another single, lone, non-interfering wave packet on the induction waveguide (5). This singular, induced electronic pulse will be rejected/reflected away by the Diode (7) due to its diminutive amplitude, just as the first induced electronic pulse was reflected away for the same reason. It will travel 'backwards' down the induction waveguide (5), through the inductor (2), and end up flowing to Ground (3).

Any other spacetime separation between an arbitrary train of discrete input wave packets will therefore not produce an output (8) signal pulse in this third example embodiment.

Figure 6:
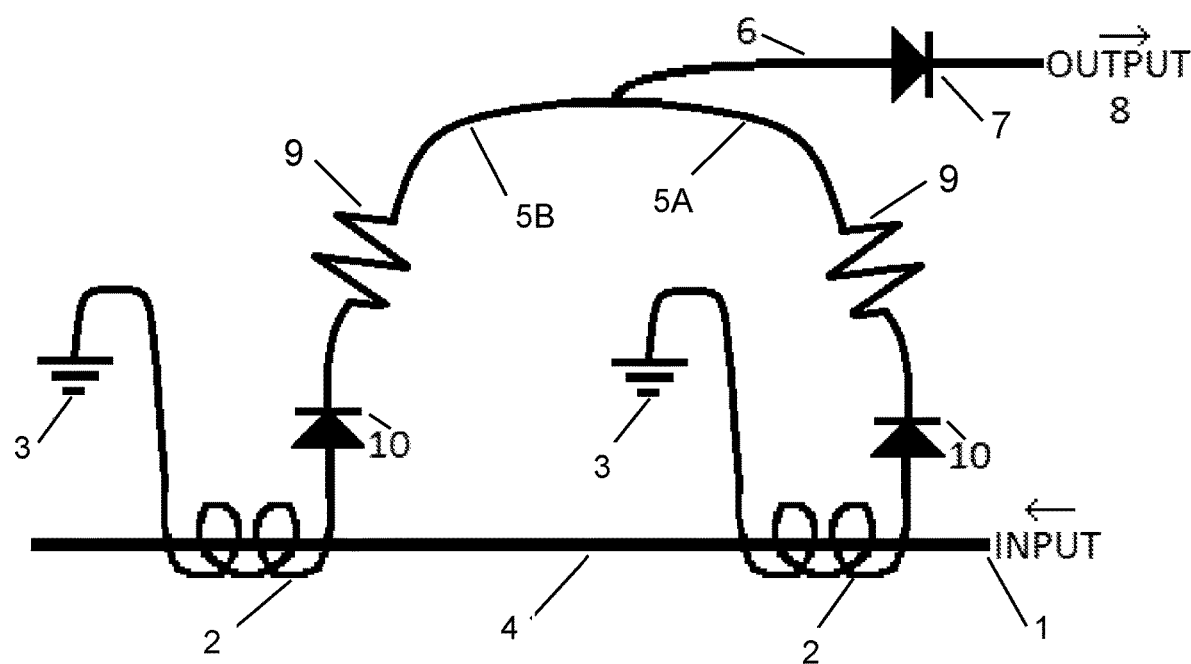
FIG. 6 is a schematic view of a serial inductor interference diode, for the purpose of discriminating ΔS(t) between two wave packets originating from the same waveguide (a fifth example embodiment).

FIG. 6 is an illustration of a fifth example embodiment: A circuit schematic of an improvement upon the invention, or the "Serial Inductance Interference Diode".

Like the fourth example embodiment, the purpose of this fifth example embodiment is to produce the discrimination of some spacetime separation ($\Delta t = \Delta s = K$, a constant) between two or more wave packets (specifically, discrete electronic pulses) which already exist on the same waveguide, as opposed to the first and second example embodiments where the target wave packets exist, initially, on separate waveguides.

This fifth example embodiment is an alternative approach to the same basic methodology as employed in the fourth example embodiment, but with a substantial difference: instead of feeding the input waveguide (1) back through the same electromagnetic inductor (2) after some loop-length (4), the fifth example embodiment uses two or more electromagnetic inductors (2) with a non-looped input wire (1) running through both inductors in a serial manner, those electromagnetic inductors (2) being separated by some distance/length of input wire (4) which plays a precisely analogous role to the loop-length (4) in the fourth example embodiment.

In order to discriminate the spacetime separation between wave packets by the novel method/machine described herein when both (or all) of those wave packets originate on the same waveguide, we first 'sample' the input waveguide (1) in two or more locations, i.e. we create copies of the input wave packets on their own separate, dedicated waveguides (5A, 5B) by the method of electromagnetic induction. More generally, one might say we are sampling the input wire (1) in two spacetime locations, one at the first location where the input waveguide passes through the first electromagnetic inductor (2), and again at the location where the input waveguide passes through the second electromagnetic inductor (2). In this electromagnetic embodiment, the user samples the input waveguides via electromagnetic induction of some kind, but in other scenarios, sampling is still possible through other methods of remote transduction of wave flux.

"Reflector" diodes (10) on each dedicated waveguides (5A, 5B) guarantees that the wave packets produced in each dedicated induction waveguide (5A, 5B) travel down the shared induction waveguide (6), towards the discriminator diode (7), instead of the potential scenario in which the wave packet travels down the opposing dedicated waveguide (5B, 5A) towards Ground (3). The "reflector" diodes (10) each have a threshold amplitude which is below the amplitude of a single induction wave packet; that is, all input wave packets are capable of hurdling this relatively low amplitude threshold. These reflector diodes (10) are included not for amplitude-discrimination purposes, but rather they are included for a more conventional directional biasing purpose, namely to produce the reflection of wave packets traveling against the direction of their bias, guaranteeing current flow through the discriminator diode (7) or guaranteeing its entrapment in the "diode box", as explained below.

The reflector diodes (10), together with the discriminator diode (7), create a kind of "diode box" which is contained/bound at three locations by the entrance/front of the discriminator diode (7) and the exit/back of the two reflector diodes (10), containing the juncture between the dedicated (5A), (5B) and shared (6) induction waveguides. Further, this "diode box" contains damping resistors (9), which are explained below. Wave packets which are too low-amplitude to pass the discriminator diode (7) become entrapped in the "diode box".

The damping resistors (9) (two are shown, but just one would also function properly) are included to "sap away" the amplitude of the wave packets which become entrapped within the "diode box", i.e. those which continue to reflect back and forth between the discriminator diode (7) and the reflector diodes (10). The amplitude of any wave packet which becomes trapped in this "diode box" will be diminished to zero by successive passes through the damping resistors (9), and thus the waveguides (5A), (5B) and (6) will return to zero electrical potential after some ring-down period, again ready to discriminate new induction wave packets. The ring-down period of the "diode box" helps to set the specific embodiment's duty cycle (time to renormalization of the voltage on the shared wire (6) after the injection of an unaccompanied induction pulse) and is primarily influenced by the impedance of the damping resistors (9), by the lengths of dedicated waveguides (5A) and (5B) and of the shared waveguide (6) contained within the "diode box" as well as the amplitude of the induced wave packets. The amplitude threshold of the discriminator diode (7) will have to take into account (in the design stage) the constant loss of amplitude in the induction wave packets caused by its passage through a single reflector diode (9) and a single damping resistor (9) on its way to the Diode (7), but this is just a matter of careful design.

This fifth example embodiment, like the fourth example embodiment, is employed to discriminate the spacetime separation between wave packets which originate from the same, single input waveguide, as opposed to the first and second example embodiments, which deal with spacetime comparisons of wave packets originating from two or more input waveguides.

Figure 7:
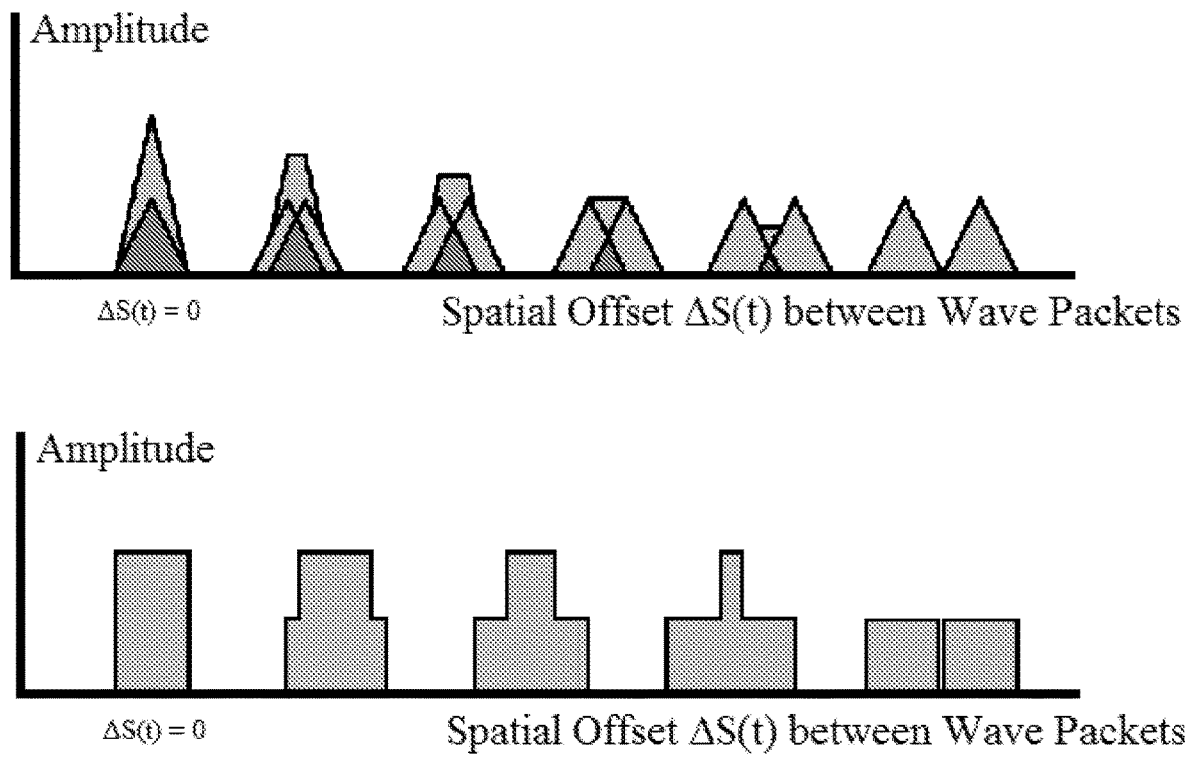
FIG. 7 is an illustration utilizing centrally-peaked wave packet interference amplitude analysis (a sixth example embodiment) showing several increasing spacetime separations/offsets between pairs of wave packets of two different amplitude profiles/shapes (centrally peaked and flat).

FIG. 7 An illustration to help describe the advantages of an improvement to the invention, or the sixth example embodiment, wherein centrally-peaked, or more generally shaped, input wave packets are utilized to produce continuous (non-binary) maximal amplitudes in the case of constructive interference between those wave packets.

Shown in FIG. 7 are several different spacetime offsets of two wave packets which exhibit two different shapes: centrally-peaked (i.e. triangular) and flat (i.e. rectangular).

Note the binary maximal amplitude of the rectangular wave packet interference: no matter the offset of the rectangular wave packets, if they exhibit constructive interference at all (regardless of by what spacetime how much), then they produce a tell-tale, constant 'above-threshold' voltage for, at least, some portion of their combined wave packet.

Note, in contrast, the continuous, non-binary maximal amplitude of the constructive interference of the centrally-peaked (triangular) wave packets: the resulting maximal amplitude of those constructively interfering wave packets changes as a function of the phase offset between them. This is potentially useful for discriminating even-finer spacetime separations between wave packets than was possible in previous embodiments, and it is envisioned as useful in further embodiments, which are not explicitly explored herein, which utilize a diode with an adjustable-threshold voltage, or (more generally) a high-amplitude-pass filter with an adjustable threshold amplitude, so as to tighten or relax the spacetime requirements imposed by the amplitude cut of the diode/high-pass filter. Other possible uses and advantages of this improvement are discussed in the sixth example embodiment itself.

Operation

In a simple electronic form, which for convenience is referred to as an "Interference Diode" or first example embodiment (shown in FIG. 2), the invention produces constructive interference between two or more wave packets (electronic pulses) by dovetailing or likewise joining two or more waveguides (5A, 5B) (conductive wires) onto a shared waveguide (6). If wave packets (electronic pulses) arrive at the juncture of (5A), (5B) and (6) at the same time, they produced maintained superposition/constructive interference, causing them to exhibit an increased amplitude (voltage, in the electronic case). The increased amplitude achieved by this relatively rare but desired case allows them (propagating, at the same speed, together) to transmit through an attached means (a diode (7), in this electronic case) for the production of a high-pass amplitude discrimination of the wave packets incident upon it (when coming from the left in FIG. 2, below). The direction of current flow is guaranteed rightwards through the diode (7) by the presumed high output impedance of the inputs themselves, and is achievable by myriad other means not discussed herein.

FIG. 2 shows a first example embodiment. This is a basic electronic embodiment of the invention. Two (or more) input wires (5) are dovetailed onto a shared wire (6), where constructive interference (superposition) may occur between two electrical pulses if they happen to arrive from their respective input wires (5A, 5B) onto the shared wire (6) at the same time. In this case, the interfering electrical pulses exhibit an increased voltage and are thereby permitted to pass through the diode's (7) high-voltage-pass filter, traveling to the output (8) wire. The output signal is a positive indication of said electric pulse superposition, which is directly tied to the relative position (i.e. the relative timing) of those electrical pulses.

It is assumed that the maximal amplitudes of the input wave packets are normalized exterior to the novel method/ machine. That is, they are each of a known shape and size when incident on input wires 5A and 5B. This is trivial to achieve in practice through myriad means, but illustrative to point out here because amplitude itself is used as the discriminating parameter for synchronicity, or superposition, of the wave packets in the novel method or machine described herein (the invention). If the input wave packets have unknown maximal amplitudes, then it follows that their constructive interference wave packet will be of an unknown maximal amplitude, confounding this method/machine.

FIG. 3 shows a second example embodiment according to the invention. This embodiment is very similar to the first example embodiment but differs in that it produces constructive interference via simultaneous remote transduction of wave flux from two or more input wires instead of by physically dovetailing the input waveguides onto a share waveguide.

In the desired case, constructively interfering (overlapping) wave packets on (6) will exhibit a larger-than-typical amplitude (voltage), which by design, is greater than the threshold voltage of the diode (7), granting such interfering wave packets passage through through the diode (7) and thereby transmitting them onto the output (8) waveguide for external discrimination. Note that a constant, known amplitude/voltage loss to the input wave packets is produced from the voltage drop of the diode itself (which is easily factored into related amplitude calculations).

In contrast, a singular, lone, non-interfering wave packet will exhibit an unchanged (nominal) amplitude while on the shared waveguide (6). This will, by design, be rejected by the diode (7) due to its below-threshold amplitude. The diode's (7) threshold voltage and the input pulse's shape and size are intentionally chosen with respect to each other so as to transmit only a premeditated plurality of constructively interfering wave packets on account of their relatively large amplitude and reject single (lone) wave packets on account of their relatively small amplitude (voltage, in the electronic case).

In the naïve calculation of the two-input geometry of the Dovetail Interference Diode, or the first example embodiment, the amplitude of constructively interfering (rectangular) electronic pulses are twice the magnitude the amplitude of non-interfering (lone) electronic pulses. An example of one appropriate diode (7) threshold voltage in this case would be an amplitude 50% greater than a that of a single, lone, non-interfering electronic pulse; this threshold voltage would reject such single, lone electronic pulses and admit interfering, overlapping electronic pulses.

Whether or not the wave packets (electronic pulses) constructively interfere as they move co-parallel on the shared waveguide (6) is based upon the wave packets' relative spacing (i.e. their relative timing, i.e. their spacetime separation) with respect to each other. This simple mechanism is the essential insight of the invention: a means for the production of the interference of wave packets combined with a means for the production of the high-amplitude pass filtering of those potentially interfering wave packets allows for a discrimination of the spacetime separation between wave packets.

Any electrical pulse which emerges from the output of the diode (7) and onto the output (8) wire signifies a positive discrimination/indication of the existence of constructive interference on the shared wire (6) in the first example embodiment, or (5) in the second example embodiment), which, for reasons explained, signifies a specific temporal/spatial relationship between two electrical pulses on that shared wire (specifically, that two electrical pulses are at least partially synchronous/overlapping on the shared wire).

Any single, non-interfered electrical pulse is rejected by the diode (7) and produces no output (8) electronic signal pulse due to its sub-threshold voltage. The only event that can produce an output signal from the first example embodiment (in the controlled, i.e. "quiet", input wire environment) is the superposition, i.e. constructive interference, or two or more synchronous wave packets incident on the two input waveguides.

Parameters of the input pulses, as well as parameters of the diode (7), factor into the temporal and amplitude-response of the invention and should be considered together in the design of all example embodiments.

Wave packet interference used together with a high-pass amplitude-threshold mechanism such as a diode affords the invention a spacetime discriminating capability of a type that is both novel and unobvious and, as shall be seen, affords myriad advantages over the prior art.

For many reasons which will become apparent, it is advantageous to produce a 'proxy set' of wave packets with which to produce interference, instead of manipulating the original input wave packets (electronic pulses) directly. This improvement affords the novel method/machine the ability to detect various $\Delta S(t)$ between two or more wave packets which originate from the same waveguide, preserving the input wave packets more or less unchanged, among other advantages. Several embodiments that use a 'proxy set' of wave packets, including the fourth and fifth example embodiments follow.

Pluralities of the invention can be used in a multiplexed fan-out methodology, or by a serial transduction methodology, to discriminate multiple spacetime separations between input wave packets, instead of just one spacetime separation.

Advantages (Over the Prior Art)

One or more aspects of one more example embodiments of the invention, as compared to known prior art methods for producing a spacetime discrimination $\Delta S(t)$ between wave packets, are cheaper and easier to manufacture, largely due to the fact that no clock, nor any time comparator is required in this invention.

One or more aspects of one more example embodiments of the invention, as compared to known prior art methods, are potentially more robust in the face of physical stress (fewer parts, no "moving parts") and less prone to performance loss over time and hysteresis.

One or more aspects of one more example embodiments of the invention offers the potential to discriminate time-intervals that are at or below the time-resolution of fastest existing clocks (atomic clocks) through miniaturization of the inter-inductor distance (4) to the microscale and beyond.

One or more aspects of one more example embodiments of the invention does not require the comparison of data points (timestamps) relating to the timing of wave packets. Rather, it passively produces the interference of those wave packets with each other, thereby (under the power of the input pulses themselves) faces discrimination by the attached diode (7).

One or more aspects of one more example embodiments of the invention reduces the "computation" time for the discrimination of $\Delta S(t)$ between wave packets to effectively 0 (instantaneous) by removing the requirement that timestamps be compared explicitly (subtracted off) and, as such, removes the need for both a clock and for time-comparator circuitry, which is required by the prior art and is the source of myriad functional limitations and costs.

An additional advantage of one or more aspects of the disclosed example embodiments over known prior art is that discrimination by the claimed method and machine preserves the original input wave packets (leaving them more or less intact). This allows for a serial multiplexed embodiment, wherein the same input wave packets are run through multiple instances of the electromagnetic inductors (2), each pair of which producing a different receptive $\Delta S(t)$, allowing for an piecemeal approximation of a continuous, i.e. non-binary, discrimination of any $\Delta S(t)$, instead of just one specific spacetime separation. This goes a long way in negating the characteristic of the invention described herein, namely that a single instance of the invention is sensitive to a single spacetime separation between wave packets only.

The timestamp comparison method is inherently more complicated and delicate than the novel means described herein, and produces relative expense, functional limitations, instabilities, and an inherent time delay.

In terms of performance as compared to existing time comparators, an instance of the fourth example embodiment with an inter-inductor spacing (4) of 1 meter is capable of producing a discrimination of the spacetime separation between two electrical pulses as small as about $1 \times 10^{-10}$ seconds, using the naive approximation that electrical signal pulses move at the speed of light. The time for an electrical pulse to travel the inter-inductor distance (4) on the input waveguide determines the spacetime separation to which that instance of the fourth example embodiment is sensitive, for which it produces an output (8) signal. At the speed of light, a wave packet takes 3 nanoseconds to traverse one meter.

With micrometer-scale inter-inductor spacing (4), the Interference Diode can produce a time-discrimination resolution on the order of $10^{-15}$ seconds (and that scale of construction is certainly possible, given the maturation of micro technology in recent decades). Further miniaturization of the inter-inductor spacing (4) improves the spacetime discrimination resolution of the Embodiments linearly, down to some fundamental limit caused by the non-locality of microstates.

For comparison, state-of-the-art computer processors currently 'max out' at several Gigahertz, or about $5 \times 10^{-10}$ second time resolution. The time-resolution of the fastest atomic clocks, which utilize the oscillation of electrons as their clocks, currently 'max out' at a time resolution of about $10^{-15}$ seconds. This means that a microscale version of some described example embodiments would be comparable in temporal resolution capability to the best atomic clocks which exist today (with no moving parts aside from the wave packets themselves).

EXAMPLE EMBODIMENTS

The example embodiments described herein are meant to represent only a small and illustrative subset of potential embodiments of this novel method/machine. The following example embodiments are not intended to limit the scope of this invention in any way. Any wave-carrying network can utilize the method/machine described herein, not just electronic ones. Choices of methodology for the input sampler (the EM-inductor), waveguides (the wires), and the amplitude-gate (the diode, i.e. some device that rejects wave flux at low wave amplitudes and transmits wave flux at high wave amplitude) are all technology-specific, and this specification is meant to describe and claim the most general form of this new machine/methodology and therefore also claims whatever forms and technologies to which this machine/methodology may be adapted.

Further, the time/space separation discrimination between two wave packets of entirely different types (such as an electrical wave packet and a photon wave packet) are possible if one or both can be converted into a "shared language", i.e. a shared wave and wave-guide format. Similarly, discrimination between any two (or more) events of any kind is possible by the means described herein due to the fact that detectors may convert events, for example, into electrical wave packets in real-time. The example embodiments described herein are by no means exhaustive; they are included to illustrate a few potential applications of the novel means described herein and to give an idea of some potential ramifications and improvements upon this invention. The following example embodiments in no way limit the scope of the intellectual property claimed by this document.

First Example Embodiment: Dovetail Interference Diode

In a simple form, this first example embodiment shown in FIG. 2 dovetails two or more input waveguides (5) (such as conductive wires), which each are the source of intermittent wave packets (such as electronic pulses), onto a shared waveguide (6) (such as a wire) in order to produce the constructive interference of said wave packets thereon in the case of an appropriate spacetime relationship among two or more of those wave packets. If constructive interference is achieved, the overlapping, superposed plurality of wave packets exhibit an increased maximal amplitude (voltage), which allows them (moving together) to pass through the attached diode's (7) high-pass filter and thereby become an output (8) signal. The diode's (7) threshold amplitude (voltage) and the input wave packet's shape and size are intentionally chosen with respect to each other so as to admit (through the diode (7)) only a premeditated plurality of interfering wave packets and reject single (lone) wave packets. In this way, a temporal/spatial comparison, albeit a binary one, of the contributing wave packets (electronic pulses) from the Input wires is achieved passively 'under the power' of the electronic pulses themselves.

This is a basic form of the invention described herein when embodied in the electronic realm. Two (or more) input wires (5) are the source of intermittent electrical signal pulses and are dovetailed onto a shared wire (6), whereupon constructive interference may occur between overlapping (superposed) electrical pulses originating from two input wires, if they happen to arrive at the juncture between the two Inputs (5A, 5B) and the shared wire (6) at the same time. In such an event, the combined, constructively interfering electronic pulse experiences an increased maximal amplitude and is thereby permitted to pass through the diode's (7) high-pass filter, thereby becoming an output (8) electronic pulse.

A basic example electronic embodiment of the invention is shown in FIG. 3 whereby the required constructive interference is achieved by the simultaneous remote induction of wave packets onto a shared waveguide (5) from two (or more) input waveguides (Input A, Input B) which pass through an electromagnetic inductor.

If wave packets travel through the inductor (2) at the same time, they induce pulses on the shared waveguide (5) at the same time, which causes said induced wave packets to exhibit constructive interference. The shared waveguide (5) leads into a high-amplitude-pass filter, namely a diode (7), for superposition discrimination as in other Embodiments.

As shown in FIG. 4, two particle detectors A and B (such as Geiger counters, Scintillation counters, or others) output electronic signals in real time if a target particle passes through their active volumes. Together, they form the inputs (5A, 5B) of a modified version of the first example embodiment, which, all taken together, acts like a coincidence array, or a particle telescope.

Waveguides 5A and 5B are of different lengths; in this case, 5A is longer than 5B. The purpose of this disparity in length is to compensate for the travel time of the target particle traveling between the physical volumes of detector A to detector B by creating a time delay in waveguide 5A through the means of an increased length of waveguide 5A (other means could be used to achieve this time delay, as well). In this way, particles with a specific trajectory (namely particles impinging detector A, then detector B, in a straight path) will produce detector outputs which reach the dovetail juncture between 5A, 5B and 6 at the same moment and thereby produce constructive interference as in the first example embodiment, allowing the detector output pulses to work together and 'jump the hurdle' of the diode (7), becoming an output (8) pulse.

In the event that a particle of a premeditated velocity impinges first detector A, then detector B, the output pulses from those detectors, by design, reach the juncture with the shared wire (6) at the same moment because the premeditated delay caused by the extra length of wire 5A precisely cancels out detector A's output pulse's "head start". The known speed of the particle (approximated as the speed of light in the highly pertinent relativistic case) combined with the spatial separation between the detectors (d), combined with the known transmission speed of wave packets in the waveguides all serve to set the extra length of 5A as compared to 5B which will cause the desired behavior. Varying any or all of these parameters will cause the varying of the specific embodiment's 'sensitive' Δt or Δs (that is, it varies which specific spacetime separation between input electrical pulses causes an Output (8) signal).

In the case that signal pulses arrive at the juncture with the shared wire (6) at the same moment, they produce maintained constructive interference on the shared wire (6), bringing their combined amplitude above that of the threshold amplitude of the diode (7), allowing them to pass the diode, producing an Output (8). Any output signal is thus a positive declaration that a coincidence existed between detectors A and B with a specific, known time differential (Δt), which is chosen, by design, to match what is expected for a particle of known (or presumed) velocity which is traversing the known distance (d) between detectors A and B.

Currently, known coincidence methods of particle physics exclusively employ time comparators, at great relative financial and functional cost. For hardwired particle detector arrays, or time-based event sensing arrays of any kind, this Embodiment shows great potential.

As always, accidental coincidence are a source of false positives in the coincidence method.

As opposed to both the first and second example embodiments, this third example embodiment, shown in FIG. 4, "samples" a single input wire (1) in two or more locations (2) by a remote transduction method such as electromagnetic induction, with intervening wire-distance(s) (4) "looped" between the sampling locations of the inductor (2). This two-or-more-point sampling produces a number of induction pulses (a "proxy set" of pulses) on an induction wire (5). The discrimination of the spacetime separation between two or more input pulses on the input wire (1) is achieved by the production of superposition of two or more "proxy" pulses on the induction wire (5) and the amplitude discrimination thereof, as described in previous embodiments.

In this fourth example embodiment, the electromagnetically (or otherwise) induced induction pulses may or may not (based upon their relative timing) constructively interfere on the induction wire (5), i.e. produce a combined (overlapping) pulse with an increased (summed) voltage. The induction wire (5) leads into a diode (7), whose threshold voltage is chosen so as to transmit only sufficiently constructively-interfering induction pulses, i.e. those produced by the superposition of some premeditated plurality of induction pulses. The diode (7) leads to the Output (8), and pulses which are transmitted through the diode (7) become output signal pulses.

If the spacetime separation between the input pulses matches the intervening-wire-distance(s) (4) between the sampling points (2) on the input wire (1), the induction pulses generated at each electromagnetic inductor (2) will be generated simultaneously and travel onto the shared wire (5) at the same moment, whereupon they will constructively interfere and travel together towards the diode (7) at an increased voltage, potentially above the threshold voltage of the diode (7), in which case the interfering induction pulses are transmitted and become an output (8) signal pulse.

If the induction pulses achieve appropriate superposition on the induction wire (5) by the virtue of appropriate relative timing, they will, because of their combined amplitude (voltage, in this electromagnetic case) be transmitted through the diode (7) and become an output (8) signal pulse. If the induction pulses achieve insufficient or no constructive interference (as would be the case if the input wire saw only a single input pulse or if the spacetime separation between two or more input pulses did not match the spacetime separation chosen by the choice of inter-inductor distance (4)), then the induction pulses remain at a sub-optimal amplitude (voltage) and therefore are reflected away from the diode (7), producing no output and flow to ground (3).

The induction pulses on the induction wire (5) are produced traveling in the opposite direction of the input pulses on the input wire (1) due to the oppositional, reciprocal nature of electromagnetic induction. For this reason, the discrimination capability of this Embodiment only works for a single input direction. In practice, this is no problem at all, but it does help illustrate the function and operation of this Embodiment.

This embodiment produces the discrimination of the existence of a specific spacetime separation between wave packets (electronic pulses) by the unique ability of such a constructively-interfering pulse to pass through the diode (7) due to its increased amplitude (voltage), a feat which is impossible for "lesser" pulses which have not achieved sufficient constructive interference. Therefore, any output (8) wave packet is a positive discrimination of the existence of superposition/constructive interference between the two or more "proxy" induction pulses on the induction wire (5), which in turn corresponds to some spacetime separation $\Delta S(t)$ between the input wave packets on the input wire (1) (by a choice of the inter-inductor distance (4)).

The Input Wire (1) passes through the reactive volume of an electromagnetic inductor (2) and is then directed, after some loop-length (4) of Input Wire (1), back through the electromagnetic inductor (2) for a second time. Passage of an input electrical pulse through the electromagnetic inductor (2) produces (via electromagnetic induction) an electrical pulse onto the induction wire (5), traveling rightwards and into the input of a diode (7), which leads to the output (8). Ground (3) is attached to the end of the induction wire (5) which is opposite the diode (7), and serves firstly to absorb induction pulses which do not pass the diode (7) and secondly to provide a source of current from which the inductor (2) draws in order to produce the induction pulses (under the "power" of an input electrical pulse itself, which is consequently diminished in magnitude by a typically small amount).

This embodiment functions by using constructive interference to 'trick' the diode (7) into passing a constructively interfered (combined) set of induction pulses if they happen to overlap on the induction wire (5), just as in other embodiments. The induction pulses in this fourth example embodiment are produced by electromagnetic induction when an input electrical pulse passes through the electromagnetic inductor (2). This only occurs when two input pulses impinge this fourth example embodiment with a spatial separation ($\Delta$s) equal to the loop-length (4). In that case, the trailing input pulse enters the inductor (2) for the first time at the same moment as the leading input pulses enters the inductor (2) for the second time, causing the two input pulses to travel through the inductor simultaneously, side-by-side, producing, naively, a double-sized induction pulse on (5).

This fourth example embodiment 'loops' the signal wire (1) through a single inductor (2) once or many times. If two input pulses inhabit the inductor at the same time, an telltale, outsized induction pulse will be produced on the inductor (2). The loop-length(s) (4) between those passes through the inductor (2) determine the specific spacetime separation between input pulses to which this fourth example embodiment responds by producing an output (8) signal.

A play-by-play of the function of this fourth example embodiment will illustrate how it works: when two electrical pulses impinge the inductor (2), the leading pulse produces a small, sub-threshold induction pulse, which travels from (2) onto (5), headed towards (7) and (8). This premature, sub-threshold induction pulse travels down the induction wire (5) until it hits the diode (7), where it is reflected due to its subthreshold amplitude (voltage). Once reflected, it travels the opposite direction, back down the induction wire (5) and eventually flowing to ground (3). The leading pulse of the pair of electrical pulses then continues down the signal wire, 'looping' back to the entrance of the Inductor (2) after some time $\Delta t$ and wire-distance traveled equal to (4). For a pair (or, more generally, a train) of input pulses whose spacetime separation matches the inter-inductor loop-length (4), the moment when the trailing pulse enters the inductor is the moment when the leading pulse re-enters the inductor (2) for a second time; both input pulses are passing through the inductor in the same direction, at the same time.

Consequently, in such a case, the induced pulse has an increased and premeditated amplitude (voltage), which can pass through the minimum-voltage-threshold of the diode (7).

Two or more input pulses incident upon this fourth example embodiment can simultaneously produce induction pulses within the inductor (2) if and only if they are separated, on the input wire, by a distance equal to the loop-length (4). In such a case, full constructive interference is produced between the induction pulses when the signal train's two or more input pulses simultaneously pass through the inductor (2). In this special and desired case, the leading input pulse first produces a lone induction pulse in the induction wire, then travels around the "loop length" (4) and ends up passing through the inductor for the second time at the same moment as the trailing input pulse passes through the inductor for the first time. At that moment, twice the current is passing through the inductor as compared the first pass, and so the induced pulse is doubled in amplitude. If such constructive interference in achieved on the inductor (2), the extra-large induced pulse travels onto the induction wire (5), exhibiting an amplitude (voltage) large enough to pass through the diode (7) attached there (i.e. pass "over" the voltage threshold of the diode (7)). The Diode (7) leads to the Output (8). Any Output (8) pulse is therefore a binary discrimination of the existence of two or more wave packets incident upon the input wire (1) which exhibit the premeditated spacetime separation ($\Delta t$, $\Delta s$), which is equivalent and determined by the loop-length (4).

In a scenario (not shown) of multiple loops through the electromagnetic inductor (2), the amplitude of the induced pulse is proportional to the degree of the (effective) constructive interference achieved. That is, if a twice-looped version of this fifth example embodiment, with three sampling locations along the input wire (1), experiences a train of just two input electrical pulses that happen to match a single spacetime separations to which this twice-looped version of this fifth example embodiment is sensitive, then a telltale induction pulse is produced which is twice the amplitude of a single, non-interfering pulse's amplitude and which is two-thirds of the amplitude of the induced pulse created by a full, or complete set of three, properly-spaced electrical pulses, i.e. the 'perfect storm', or maximal amplitude event.

Complications with of this fourth example embodiment include wire-to-wire interference and wire-to-wire inductance within the reactive volume of the inductor (2) itself. The more wires one passes through a single inductor, the more potential for interaction and electromagnetic inductive 'choke' effects, which will increase resistance and potentially wash out signal pulse shapes (including, most notably, amplitude).

The constructive interference in this fourth example embodiment, as well as in the second example embodiment, is achieved 'on-air' rather than 'on-waveguide', without a material dovetail, or confluence, of waveguides. Consequently, the direction of induced pulses on the induction wire (5) is unambiguous, namely toward the diode (7), which is intrinsically appealing in its simplicity. This may have unique advantages over other Embodiments due to this fact.

It should be noted that passing the output (8) wire back into the same, single electromagnetic inductor (2) (after an appropriate amplification process so as to renormalize the output pulses to the size and shape of the input pulses, and after a premeditated time delay) would afford the embodiment a new type of functionality whereby logical comparisons (spacetime comparisons) can be made between the outcome of previously completed logical comparisons (spacetime comparisons). More complicated 'loops' of 'chains' of instances of this fourth example embodiment are also envisioned.

This fifth example embodiment, or the Serial Induction Interference Diode, shown in FIG. 7, comprises an input wire (1) along which two or more electromagnetic inductors (2) are positioned (to "sample" input signal) with one or more inter-inductor distances (4) of input wire (1) between their locations. Each electromagnetic inductor (2) is attached, on one side, to ground (3), and on the other side to a dedicated induction wire (5). The multiple induction wires (5) dovetail, or physically join onto a shared wire (6) and lead into a diode (7), which is also the source of the output (8).

When the input wire (1) is the source of a plurality of electrical pulses which exhibits at least one spatial separation between those electrical pulses which happens to match the spatial separation between the electromagnetic inductors (2), there is a moment when two electrical pulses inhabit both electromagnetic inductors (2) simultaneously, and thus induce electrical pulses in those inductors simultaneously. These simultaneously-created induction pulses travel at a constant speed down their respective induction wire (5) (which is equal in length to the other induction wire (5), in the naive form of this embodiment) until they dovetail (physical join) onto a single, shared wire (6), causing them to constructively interfere thereupon. Only when all of the inductors in the SIID (or at least a premeditated plurality) contribute a induction pulse to the shared wire (6), and thus the attached diode (7), at the same time, do they achieve a combined (summed) voltage which allows the constructively interfering plurality of induction pulses to transmit through the diode (7) and become an output (8) pulse. The parameters of the electromagnetic inductors (2), the inter-inductor distance (4), and the diode (7), together with the choice of input pulse characteristics, all govern the response-action of this fifth example embodiment.

Varying the length of one separate, dedicated induction wire (5), while holding the length of the other constant, is tantamount to varying the inter-inductor distance (4) between the electromagnetic inductors (2); they both are handles/toggles for changing the responsive $\Delta S(t)$ of the embodiment.

A moveable set of electromagnetic inductors (2) (or, generally, transducers) is also envisioned, so that the inter-inductor distance (4) is changeable, or tunable, so that the Embodiment can be made sensitive to a succession of different $\Delta S(t)$ with a simple mechanical adjustment.

The "reflector" diodes (10) on each induction wire (5) in the fifth example embodiment form a mechanism which guarantees that an induction pulse on the induction wire (5) is unable to travel towards the opposing ground (3), located at the end of the opposing Induction wire (5), when it confronts the dovetail juncture between the induction wires (5) and the shared wire (6). That is, the "reflector" diodes (10) guarantee that the induction pulses travel towards the "discriminator" diode (7) via the shared wire (6) as opposed to down the opposing Induction wire (5). The "reflector" diodes (10) each have a threshold amplitude which is well-below the amplitude of a single induction wave packet; that is, these reflector diodes (10) are included not for amplitude-discrimination purposes, but rather for directional biasing purposes only; as will be seen, they form two of the edges of the 'diode box'. That is, an induction pulse is kept from traveling in the "wrong" direction down the opposing induction wire (5) because in such a case it will hit the backside of the "reflector" diode (10) and be reflected back up the opposing induction wire (5) towards the dovetail juncture. The known loss of wave amplitude by these "reflector" diodes (10) in this embodiment must be factored into the amplitude calculations regarding the discrimination diode (7) threshold amplitude, but this is easily accounted for.

The "damping" resistors (9) are included to decrease, eventually to zero, the amplitude of wave packets that don't exhibit synchrony (i.e. constructive interference) on the shared wire (6) and which continue to reflect between the discriminator diode (7) and the reflector diodes (10). That is, such pulses become "trapped" in a "diode box" alluded to above. After many reflections in this "diode box", the amplitude (voltage) of that electrical pulse will be diminished to zero by the damping resistors (9), and (5) and (6) all return to zero electrical potential, i.e. will return to an active duty cycle, fully ready to discriminate the spacetime separation between more pairs of induction pulses.

An improvement upon the invention whereby one or more amplitude characteristics of the constructive interference between centrally peaked input wave packets (top row in FIG. 7) are employed to yield improved spacetime discrimination of the separation between input wave packets by the invention as compared to the use flat input wave packets (bottom row).

FIG. 7 shows centrally-peaked wave packets (triangular in this case) constructively interfere on the shared waveguide in such a way as to produce a variable combined amplitude which is a function of the spacetime separation between the wave packets. That is, a fully in-phase pair of triangular wave packets (top left) will produce a maximal combined amplitude which is greater than a slightly out-of-phase pair (i.e., those that are only partially interfering/overlapping), whereas "flat" wave packets (bottom row) exhibit only a single magnitude of combined amplitude when they produce constructive interference at any phase-offset.

The displacement of constructively interfering wave packets by partial packet widths (corresponding to temporal/spatial offsets that produce at least some amount of overlap between the wave packets) produces varying maximal amplitudes in the case of centrally-peaked wave packets, whereas such displacement produces one of two binary maximal amplitudes in the case of two rectangular, interfering wave packets (FIG. 7). An adjustable-voltage diode (7), used in conjunction with this sixth example embodiment, allows for adjustable stringency in the application of the the diode's (7) amplitude discrimination capability. For example, if maximal precision is required, the adjustable diode's (7) threshold amplitude can be set relatively high so that a successful passage through the diode (7) requires complete superposition (overlap) of the two centrally-peaked wave packets. This stringent requirement corresponds to the precise synchronicity of induction pulses in the sampling inductors (2), as in the top-right combined wave packet in FIG. 7. As the threshold amplitude of the adjustable diode (7) is decreased, less-than-completely overlapping (but still overlapping) induction wave packets can still, together, reach adequate amplitude (voltage) to pass the diode (7).

Centrally-peaked input wave packets, in conjunction with a variable-threshold diode whose threshold amplitude (e.g. voltage) may be adjusted, together allow for a user to adjust the stringency of the invention's receptive spacetime separation condition at will. That is, one may widen or narrow the acceptance window of ΔS(t) between wave packets by adjusting the threshold amplitude (e.g. voltage) of the adjustable diode (7).

By using non-linear pulse shapes, one can intensify or weaken the phase-dependence effect of the constructive interference described in this fifth example embodiment. That is, if the input pulses' voltage-vs-time profiles are concave-down (and centrally-peaked), the intensity of the effect employed by this sixth example embodiment will be minor as compared to if the input pulses' voltage-vs-time profiles are concave up (and centrally-peaked). That is, the more centrally peaked the pulses, the greater this effect.

Applications, Uses

Applications of the invention described herein are diverse and far-reaching. Some of these applications include many kinds of time-difference-based signal processing, including frequency analysis, interferometry, sonar and radar, time keeping and for the coincidence method of event sensing, to name only some. Several such applications are discussed below, but should by no means be construed as a limitation on the scope or application of the novel method/machine described herein: they are included to help illustrate possible manifestations of the invention only, and do not limit the claims of this document in any way.

One application of the invention is for the coincidence method of particle physics, specifically in supplanting the timestamp comparison methodology that pervades the field in the modern era, and has dominated it for nearly a century. Adoption of the invention in any number of particle detection schemes could drastically reduce the cost of particle physics research and industry and allow for such schemes' expansion into new markets and operating environments (due to increased robustness, decreased weight, lack of re-calibration (no-drift), and potentially a vastly decreased cost as compared to the timestamp-comparison methodology).

Further applications of the novel method/machine described herein include use in nuclear medical imaging (X-rays, PET, etc), use in spectroscopy and use in particle tomography methods such as muon tomography, for employment in the service of nuclear deproliferation (detection of high-Z material) and in geology, archeology and other fields.

The invention could be adapted to be used as a logic gate for computer processing, or as a frequency calibration device. The ability to simply and passively achieve the discrimination of, potentially, very short time separations between wave packets at vastly decreased costs may open new up unforeseen applications for the spacetime comparison of wave packets.

The novel method/machine could also be used to measure the propagation speed of a single wave packets by a modification of the method of 'proxy wave packets' described previously, and employed in third and fourth example embodiments. That is, non-equal lengths of dedicated waveguides 5A, 5B can bring 'into focus' only wave packets passing through the device that exhibit a predetermined propagation speed, without the use of timestamps and in real-time. If a single input wave packet is traveling too fast or too slow, the induced wave packets don't align when they reach the shared waveguide (6) and don't pass through the attached high-pass filter.

The invention described herein represents a fundamental innovation in wave packet separation discrimination and possible applications far exceed the small list of examples given here.

What is claimed is:

1. A method for determining whether a plurality of input wave packets are superposed, said method comprising:
   determining an amplitude of said plurality of input wave packets;
   transmitting said plurality of input wave packets when said amplitude of said plurality of input wave packets is above a predetermined threshold; and
   rejecting, via a high-pass filter, said plurality of input wave packets when said amplitude of said plurality of input wave packets is below said predetermined threshold,
   wherein said amplitude above said predetermined threshold indicates said plurality of input wave packets are superposed and said amplitude below said predetermined threshold indicates said plurality of input wave packets are not superposed.

2. The method according to claim 1, wherein said plurality of input wave packets are superposed via constructive interference of said plurality of input wave packets.

3. The method according to claim 1, wherein said high-pass filter is a semiconductor diode.

4. The method according to claim 1, further comprising delaying a spacetime propagation of one or more of said input wave packets.

5. The method according to claim 4 wherein said delaying said spacetime propagation comprises lengthening one or more input waveguides on which said input wave packets propagate.

6. The method according to claim 1, wherein said input wave packets have amplitude profiles which are centrally peaked with respect to time.

7. The method according to claim 1, wherein said plurality of input wave packets are transmitted via the high-pass filter.

8. The method according to claim 7, wherein the high-pass filter is a diode.

* * * * *